(12) United States Patent
Cooper et al.

(10) Patent No.: US 10,563,764 B2
(45) Date of Patent: Feb. 18, 2020

(54) COATED STEEL PISTON RING

(71) Applicant: MAHLE International GmbH, Stuttgart (DE)

(72) Inventors: Alexander Cooper, Maple Rapids, MI (US); Robert Piccard, St. Johns, MI (US); Thomas Smith, Muskegon, MI (US); Thomas Stong, Kent City, MI (US)

(73) Assignee: MAHLE International GmbH, Stuttgart (DE)

( * ) Notice: Subject to any disclaimer, the term of this patent is extended or adjusted under 35 U.S.C. 154(b) by 189 days.

(21) Appl. No.: 15/606,093

(22) Filed: May 26, 2017

(65) Prior Publication Data

US 2018/0340612 A1    Nov. 29, 2018

(51) Int. Cl.

| | |
|---|---|
| *F16J 9/26* | (2006.01) |
| *C21D 1/18* | (2006.01) |
| *C21D 6/00* | (2006.01) |
| *C21D 9/40* | (2006.01) |
| *C22C 38/00* | (2006.01) |
| *C22C 38/02* | (2006.01) |
| *C22C 38/04* | (2006.01) |
| *C22C 38/22* | (2006.01) |

(Continued)

(52) U.S. Cl.
CPC .............. *F16J 9/26* (2013.01); *C21D 1/18* (2013.01); *C21D 6/002* (2013.01); *C21D 6/005* (2013.01); *C21D 6/008* (2013.01); *C21D 9/40* (2013.01); *C22C 38/002* (2013.01); *C22C 38/02* (2013.01); *C22C 38/04* (2013.01); *C22C 38/22* (2013.01); *C22C 38/24* (2013.01); *C23C 14/0605* (2013.01); *C23C 14/0641* (2013.01)

(58) Field of Classification Search
USPC .............. 277/442; 29/888.074; 428/408, 698
See application file for complete search history.

(56) References Cited

U.S. PATENT DOCUMENTS

| | | |
|---|---|---|
| 2,183,358 A | 12/1939 | Six |
| 2,495,474 A | 1/1950 | Phillips |
| 3,850,205 A | 11/1974 | Frailly |

(Continued)

FOREIGN PATENT DOCUMENTS

| | | | |
|---|---|---|---|
| CN | 101033527 | * | 9/2007 |
| CN | 104451397 | * | 3/2015 |

(Continued)

OTHER PUBLICATIONS

"Load carrying capacity evaluation of coating/substrate systems for hydrogen-free and hydrogenated diamond-like carbon films" Tribology Letters 6 pp. 63-73 (Year: 1999).*

*Primary Examiner* — Archene A Turner

(74) *Attorney, Agent, or Firm* — Collard & Roe, P.C.

(57) ABSTRACT

A piston ring is formed from a steel substrate consisting of the carbon in a range of 0.80-0.95 wt. %, silicon in a range of 0.30-0.55 wt. %, manganese in a range of 0.25-0.5 wt. %, phosphorus in a range of up to 0.04 wt. %, sulfur in a range of up to 0.04 wt. %, chromium in a range of 17-18 wt. %, molybdenum in a range of 0.70-1.25 wt. %, vanadium in a range of 0.05-0.15%, the remainder iron. The ring has been through hardened and tempered so that it has a hardness of 46-54 HRC. A coating is then applied via PVD or other suitable methods onto the ring surface to create the finished piston ring.

8 Claims, 4 Drawing Sheets

Relative hardness of alloy carbides, cementite, and martensite in high-speed steels. Source: Ref 5

(51) Int. Cl.
C22C 38/24 (2006.01)
C23C 14/06 (2006.01)

(56) References Cited

U.S. PATENT DOCUMENTS

| | | | |
|---|---|---|---|
| 7,458,585 | B2 | 12/2008 | Hamada et al. |
| 7,951,756 | B2 | 5/2011 | Konishi et al. |
| 8,592,050 | B2 | 11/2013 | Ogawa et al. |
| 9,551,419 | B2 | 1/2017 | Kantola et al. |
| 2013/0174419 | A1 | 7/2013 | Meyer |
| 2014/0311437 | A1* | 10/2014 | Lopez ............... F16J 9/206 29/888.074 |
| 2015/0362072 | A1 | 12/2015 | Higuchi et al. |

FOREIGN PATENT DOCUMENTS

| | | | |
|---|---|---|---|
| DE | 28 52 641 A1 | | 6/1980 |
| EP | 1 132 663 A2 | | 9/2001 |
| JP | 03-122257 | * | 5/1991 |

* cited by examiner

Relative hardness of alloy carbides, cementite, and martensite in high-speed steels. Source: Ref 5

COATED STEEL PISTON RING

BACKGROUND OF THE INVENTION

1. Field of the Invention

This invention relates to a piston ring for use in pistons for internal combustion engines. In particular, the invention relates to a through-hardened steel piston ring having a generally rectangular or keystone cross-section, and which has been coated via deposition, plating or thermal spraying with a coating.

2. The Prior Art

Piston rings are often coated with a ceramic or other coating via various deposition process, such as PVD, or thermal spray techniques, to improve their wear resistance. These rings are often case hardened prior to coating using a nitride or carburize process. Such processes via heat treatment case hardens a depth from the outer surface of the ring while leaving the untreated interior of the ring at a much lower hardness and close to the green stock wire. This leads to a harder surface of the ring yet allows the ring to have enough flexibility to function in the piston and allow for easy shaping before the case hardening treatment. One drawback of the case hardened piston rings is that their case hardening lowers the fatigue resistance and can lead to cracking of the piston ring. Therefore, it would be desirable to create a piston ring that increases the fatigue strength and wear resistance of the ring.

SUMMARY OF THE INVENTION

It is therefore an object of the invention to provide a coated piston ring that improves the lateral wear and reduces the propagation of cracking of the ring by increasing the hardness through the entire cross-section. It is another object of the invention to provide a coated piston ring which prevents excessive cracking and flaking of the coating over time. In the past, increasing the hardness of the ring posed process issues, as shaping the high hardness wire is difficult and may cause breakage at the range of this invention.

These objects are accomplished by a piston ring that has been through-hardened and then coated via a deposition process such as physical vapor deposition (PVD), or thermal spraying with a coating or plating. The through-hardening process takes place by heating the ring to a temperature above the transformation range of the ring material and rapid cooling to room temperature. This may be performed in air or in a controlled atmosphere to protect the ring's surface. The ring is then reheated to a lower temperature to temper to the desired final hardness range.

The ring in one form is made of (AISI440B) steel, which is a martensitic stainless steel which has been alloyed with Cr and Mo. The AISI440B steel is 17-18% Cr and has been drawn, cold rolled, formed into a ring, and then hardened and tempered. The resulting steel is a high hardness matrix of tempered martensite with an evenly dispersed distribution of small and large complex carbides. Non-metallic inclusions do not exceed grade 2 of ASTM-E-45-Plate 1 classification. Decarburization, if any, does not exceed 0.010 mm. The AISI440B steel has a tensile strength of 1125 to 1325 Mpa and a wire hardness of 38 to 42 HRC. AISI440B has been found to perform better for this application than other commonly used steels, due to the large and small complex carbides that are not in such materials as AISI9254 and hardened ductile iron, or other case hardened steels.

The coating can be any suitable coating, such as Cr—N, Cr—Mo, or any other commonly used coating for piston rings. The coating can be deposited by any suitable means, such as by PVD, plating or thermal spraying. The coating on the outer diameter surface acts to increase the wear resistance of the piston ring as it seals against the cylinder wall. In addition, the coating may provide thixotropic benefits that may improve the rings performance within a running engine. In one example, the coating is a Cr—N PVD applied coating, but it could be a diamond like carbon coating of amorphous carbon, or various other materials known in the ring art and applied by thermal spraying or plating processes.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings.

DETAILED DESCRIPTION OF THE PREFERRED EMBODIMENT

Figure 1A:
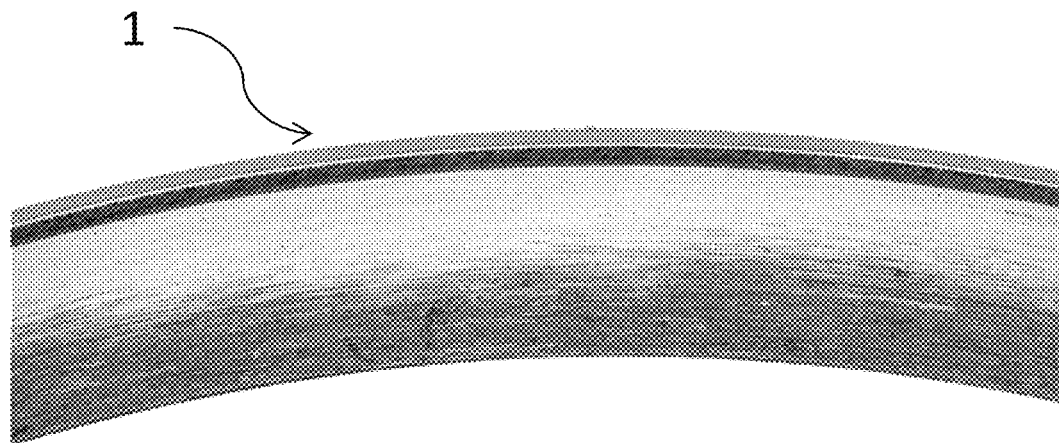
FIG. 1A shows a section of a piston ring according to the invention.
Figure 1B:
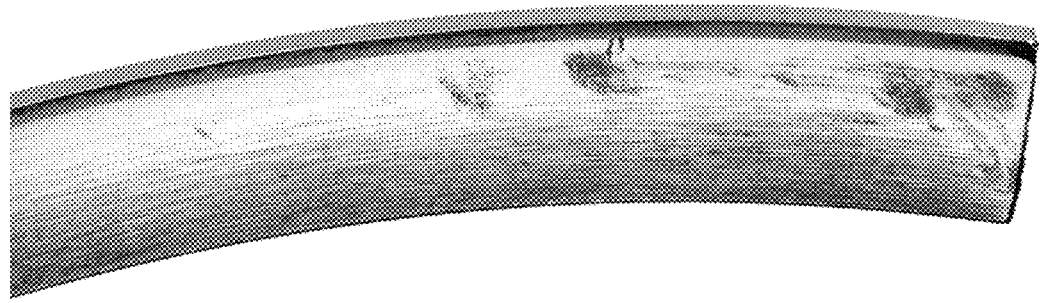
FIG. 1B shows a section of a piston ring according to the prior art.
Figure 2:
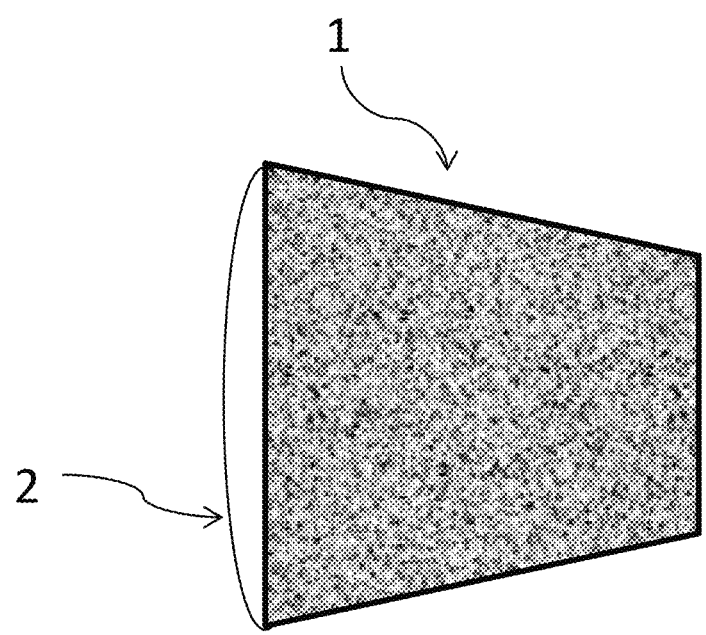
FIG. 2 shows a cross-section of the piston ring according to the invention.

The piston ring 1 according to the invention as shown in FIGS. 1 and 2 is formed from AISI440B Steel that after rolling and forming has been completed, is through hardened by heating above the transformation stage, rapid quenching and then reheating to a lower temperature to temper the ring and heat shape it on a cam shaped plug. The ring is lapped, and grinding is done on an outer diameter surface, in preparation for coating. The ring is then coated with a coating 2, via PVD or other suitable methods. The coating 2 is located on the outer diameter surface of the ring and offers a running surface for sealing against the cylinder wall (not shown), as is well known in the art.

The material of the piston ring in one form, AISI440B steel, has the following composition (shown as percentages by weight) across two different specifications:

| Elements | Specification A | Specification B |
| --- | --- | --- |
| C | 0.80-0.95 | 0.80-0.95 |
| Si | 0.50 max | 0.30-0.55 |
| Mn | 0.25-0.40 | 0.25-0.50 |
| P | 0.040 max | 0.040 max |
| S | 0.040 max | 0.040 max |
| Cr | 17.0-18.0 | 17.0-18.0 |
| Mo | 1.00-1.25 | 0.70-1.15 |
| V | 0.08-0.15 | 0.05-0.10 |

The AISI440B metal wire, before any heat treatment, has a hardness HR30N of 58-62, an HRC of 38-42, and an HV of 370-420. The material has a tensile strength of 1000-1325 MPa. The lower hardness of the AISI440B metal is typically needed to allow for the coiling and shaping of the wire, before it is case hardened or heat treated, since hardness rating that are higher commonly have cracking issues during the shaping process.

Figure 3:
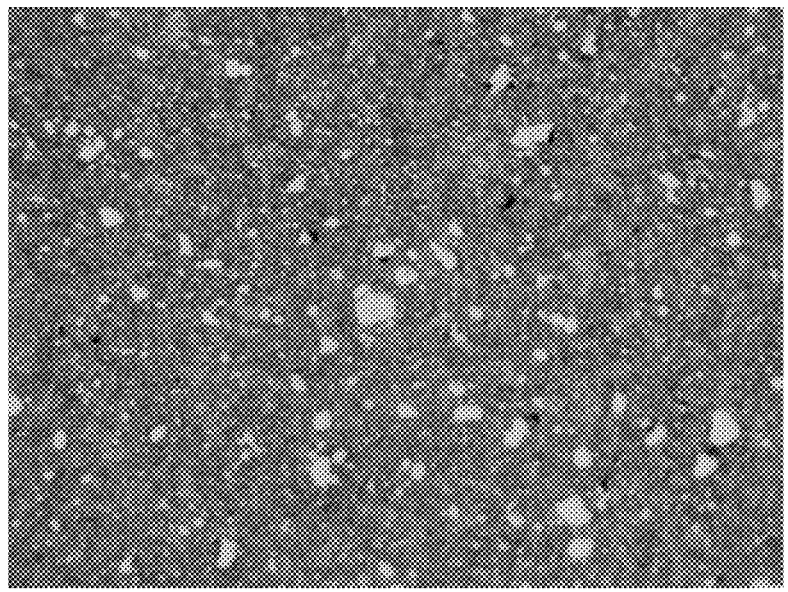
FIG. 3 shows a photograph of the material used in the piston ring according to the invention.

The AISI440B steel composition according to the invention is shown magnified in FIG. 3, after the through-hardening process. As can be seen, the AISI440B steel has a complex mix of small and large carbides present, which increases the hardness of the overall material. Carbides with hardened matrix increases the fatigue strength, wear resistance, and galling resistance of the piston ring. In addition, the AISI440B steel with the mix of carbides allows increasing wear resistance and fatigue improvements even without additional plating, and no nitride or case hardening processing. The AISI440B uses the hard carbide compounds as added wear protection. Having been through hardened, the ring has no soft matrix and exhibits improved wear surface as compared to case hardened materials, as the case hardened surface may wear through, possibly causing failure of the ring. The carbides in combination with a through hardened ring remove one failure mode of the ring and the case hardened surface. The through hardened metal with the even distribution of the complex carbides provide a hard compound that protects against wear and galling of the lateral sides. At lower HRC of 42-43, there will be galling. The combination of the increased carbides within a high hardness martensitic matrix of the steel of the present invention improves galling resistance and reduces the fatigue failure of case hardened materials.

FIG. 1 illustrates the improvement of the subject invention, as after 1000 hours there is no visible galling of the lateral surfaces. In contrast, FIG. 1B illustrates a prior art case hardened ring and galling is noted on the lateral side surfaces. In addition, the increased hardness and through hardening treatment increase the fatigue strength by approximately 20% and greatly reduces the likelihood of crack propagation due to the lateral wearing through the case hardened depth.

Figure 4:
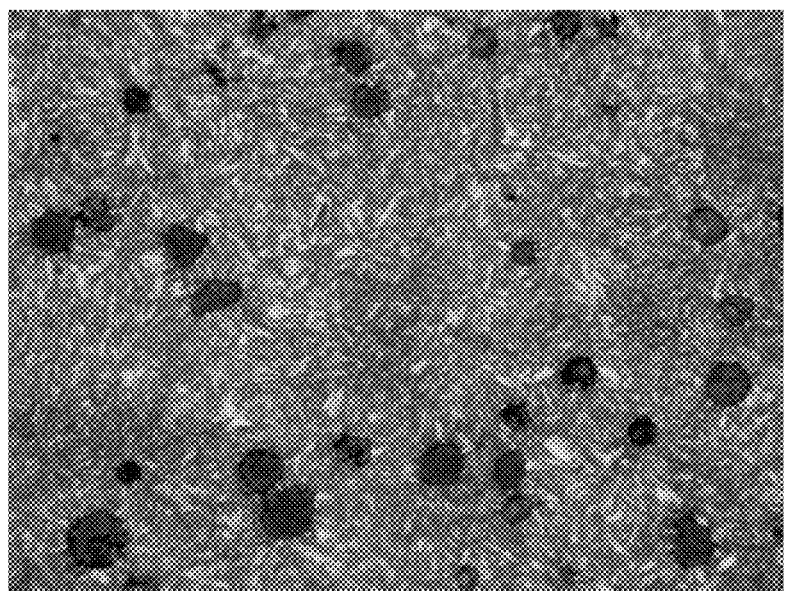
FIGS. 4 and 5 show photographs of comparison materials.
Figure 5:
Figure 6:
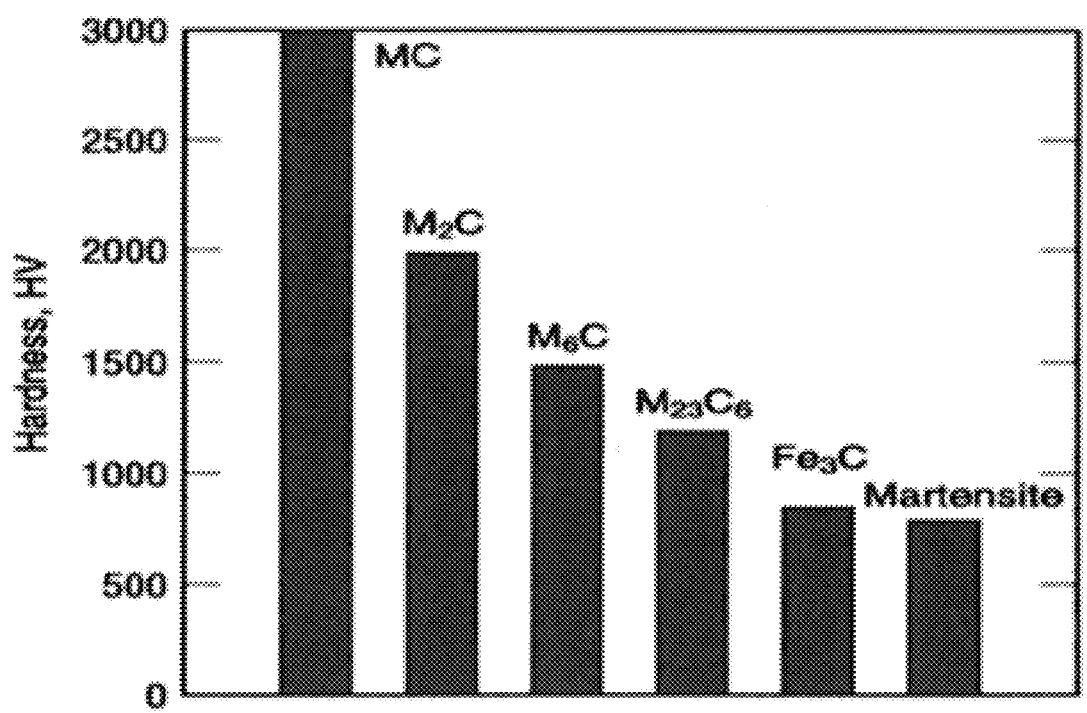
FIG. 6 shows a graph of common steel compounds comparing the material hardness according to the invention with other materials.

In comparison, other materials such as hardened ductile iron, which is shown in FIG. 4, is lacking the complex distribution of carbide particles of ANSI440B. AISI9254 (FIG. 5) has no carbides at all. As shown in FIG. 6, basic Martensite, which is similar to AISI9254, a Cr—Si steel shown in FIG. 5, has substantially lower hardness than $Fe_3C$ (cementite), which is similar to hardened ductile iron (FIG. 4) and especially lower hardness when compared to the complex carbides of MC, $M_2C$, $M_6C$ and that are present in the AISI440B steel of the present invention.

Through-hardening the formed ring that is made with the carbide-rich steel, such as the composition disclosed above for the AISI440B steel, results in a ring that exhibits substantial hardness and resistance to bending or flexing of the outer surface of the coating, especially when compared to case-hardened materials. The coating thus adheres exceptionally well and is more resistant to flaking, since the ring metal does not have a soft metal matrix below the case hardened surface depth that may flex to propagate cracks in the OD coating. In addition, by through hardening the ring, some typical failure modes with the ring are avoided, such as nitriding or case hardening wearing through on the lateral sides, causing galling and at time ring failures.

In addition, the increased lateral side protection is achieved with of the steel of the present invention, which provides for a harder lateral surface, since the complex mix of carbides in the material of the present invention provides increased wear resistance. Also, since the steel is through hardened, there is no case hardened surface to wear through in high load applications. Therefore, increasing the hardness of an AISI440B metal with the carbides may reduce the periodic galling of the ring, particularly on the lateral sides of the piston ring. In some instances the through hardening may also eliminate the need for side chrome plating, and/or nitriding of the ring material before applying the coating. The hardened ring according to the invention has an increased hardness to a range greater than 45 HRC and in some embodiments above 48 HRC. In one example, the hardness is further increased, targeting above 50 HRC and with the range of 46-54 HRC. The increased hardness and formation of the complex carbides in the AISI440B ring results in an improvement to the fatigue strength by a minimum of 20% compared to the same base material that has been nitrided, chrome plated, and OD coated with a similar coating composition.

The through hardening heat treatment further provides improvement to the manufacturing process of the piston ring, by lowering the machining cost. The process allows for the removal of the typical additional keystone grinding operation after the case hardening treatment of the ring.

Accordingly, while only a few embodiments of the present invention have been shown and described, it is obvious that many changes and modifications may be made thereunto without departing from the spirit and scope of the invention.

What is claimed is:

1. A piston ring comprising:
    a steel substrate consisting of the following components:
    carbon in a range of 0.80-0.95 wt. %
    silicon in a range of 0.30-0.55 wt. %
    manganese in a range of 0.25-0.5 wt. %
    phosphorus in a range of up to 0.04 wt. %
    sulfur in a range of up to 0.04 wt. %
    chromium in a range of 17-18 wt. %
    molybdenum in a range of 0.70-1.25 wt. %
    vanadium in a range of 0.05-0.15%
    the remainder iron, and
    a coating on the steel substrate,
    wherein the piston ring has a hardness of 38-42 HRC through an entire thickness of the piston ring after through-hardening and tempering.

2. The piston ring according to claim 1, wherein the coating has been applied by physical vapor deposition.

3. The piston ring according to claim 1, wherein the coating is Cr—N.

4. A method for forming a piston ring comprising:
    forming a ring with a steel substrate, the steel consisting of:
    carbon in a range of 0.80-0.95 wt. %
    silicon in a range of 0.30-0.55 wt. %
    manganese in a range of 0.25-0.5wt. %
    phosphorus in a range of up to 0.04 wt. %
    sulfur in a range of up to 0.04 wt. %
    chromium in a range of 17-18 wt. %
    molybdenum in a range of 0.70-1.25 wt. %
    vanadium in a range of 0.05-0.15%
    the remainder iron, and
    through-hardening the ring by heating the ring above a transformation temperature of the steel, quenching the heated ring and tempering the ring by re-heating the ring to achieve a hardness of 38-42 HRC through an entire thickness of the piston ring; and
    applying a coating to the ring.

5. The method according to claim 4, wherein the step of applying the coating comprises applying the coating via physical vapor deposition.

6. The method according to claim 5, wherein the coating is formed of Cr—N.

7. The piston ring according to claim 6, wherein the coating is Cr—N.

8. The piston ring according to claim 1, wherein the coating is Cr—N.

* * * * *